United States Patent
Yoshimura

(10) Patent No.: US 8,888,558 B2
(45) Date of Patent: Nov. 18, 2014

(54) PROBE PIN AND METHOD OF MANUFACTURING THE SAME

(75) Inventor: Fumihiko Yoshimura, Yokosuka (JP)

(73) Assignees: Kabushiki Kaisha Toshiba, Tokyo (JP); Toshiba Materials Co., Ltd., Yokohama-Shi (JP)

(*) Notice: Subject to any disclaimer, the term of this patent is extended or adjusted under 35 U.S.C. 154(b) by 0 days.

(21) Appl. No.: 13/619,417

(22) Filed: Sep. 14, 2012

(65) Prior Publication Data

US 2013/0029564 A1   Jan. 31, 2013

Related U.S. Application Data

(62) Division of application No. 12/866,397, filed as application No. PCT/JP2009/052053 on Feb. 6, 2009, now abandoned.

(30) Foreign Application Priority Data

Feb. 6, 2008  (JP) ................................. 2008-026527

(51) Int. Cl.
*B24B 5/00*  (2006.01)

(52) U.S. Cl.
USPC .............................. 451/49; 451/28; 451/283

(58) Field of Classification Search
USPC ......... 451/28, 48, 49, 51, 242, 246, 283, 285, 451/909
See application file for complete search history.

(56) References Cited

U.S. PATENT DOCUMENTS

| | | | | |
|---|---|---|---|---|
| 5,993,296 A | * | 11/1999 | Rogers | 451/49 |
| 6,015,338 A | * | 1/2000 | Hong et al. | 451/541 |
| 6,016,061 A | | 1/2000 | Mizuta | |
| 6,018,860 A | * | 2/2000 | Smith et al. | 29/558 |
| 6,170,116 B1 | | 1/2001 | Mizuta | |
| 6,633,176 B2 | * | 10/2003 | Takemoto et al. | 324/755.01 |
| 6,646,455 B2 | | 11/2003 | Maekawa et al. | |
| 7,279,912 B2 | | 10/2007 | Leon | |

(Continued)

FOREIGN PATENT DOCUMENTS

| JP | 52 51197 | 4/1977 |
|---|---|---|
| JP | 6-246616 | 9/1994 |

(Continued)

OTHER PUBLICATIONS

Japanese Office Action issued on May 7, 2013, in Japanese Patent Application No. 2009-552538.

*Primary Examiner* — Eileen P. Morgan
(74) *Attorney, Agent, or Firm* — Oblon, Spivak, McClelland, Maier & Neustadt, L.L.P.

(57) ABSTRACT

A probe pin having a bent portion at its tip end portion is used for a probe card, the probe pin is configured such that an angle constituted by a direction of work groove generated at a time of machine-working of a tip end portion of the probe pin and a longitudinal direction of a metal wire is set to 45 degree or less, or both directions are set to be almost parallel to each other. Due to above configuration, even if the tip end portion of the probe pin is subjected to a bending work and a worked surface is formed with recessed portion, a breakage of the probe pin caused by the recessed portion existing on the worked surface and functioning as a starting point of the breakage can be effectively prevented whereby a lowering of a production yield of the probe pin can be greatly suppressed.

3 Claims, 3 Drawing Sheets

(56) References Cited

U.S. PATENT DOCUMENTS

| | | |
|---|---|---|
| 7,388,296 B2 | 6/2008 | Urashima et al. |
| 7,465,218 B2 * | 12/2008 | Kobayashi ............... 451/28 |
| 8,147,294 B2 * | 4/2012 | Sasaki et al. ............. 451/41 |
| 2005/0191952 A1 * | 9/2005 | Mitarai ................... 451/314 |
| 2007/0122548 A1 * | 5/2007 | Inaba et al. ............. 427/180 |
| 2008/0182483 A1 * | 7/2008 | Kobayashi ............... 451/28 |
| 2009/0099535 A1 * | 4/2009 | Wang et al. ............. 604/272 |

FOREIGN PATENT DOCUMENTS

| | | |
|---|---|---|
| JP | 7 276211 | 10/1995 |
| JP | 2000-147004 | 5/2000 |
| JP | 2005 1027 | 1/2005 |
| JP | 2005 3516 | 1/2005 |

* cited by examiner

PROBE PIN AND METHOD OF MANUFACTURING THE SAME

CROSS-REFERENCE TO RELATED APPLICATIONS

The present application is a divisional of U.S. application Ser. No. 12/866,397 filed on Aug. 5, 2010, and is based on PCT/JP2009/052053 filed on Feb. 6, 2009, and claims priority to JP 2008-026527 filed on Feb. 6, 2008, the entire contents of each of which are hereby incorporated herein by reference in their entirety.

TECHNICAL FIELD

The present invention relates to a probe pin (probe needle) and a method of manufacturing the probe pin, and particularly relates to a probe pin and a method of manufacturing the probe pin capable of effectively suppressing a breakage of a tip end portion of the probe pin during a bending work process of the tip end portion of the probe pin and when the probe pin is actually used as a product, and capable of drastically improving a production yield, quality and durability (longevity) of the probe pin when used as a component of a probe card or the like.

BACKGROUND ART

Conventionally, in an electrical test (hereinafter, referred to as "wafer test") which is conducted in a wafer testing process for testing a semiconductor integrated circuit, a probe card attached with at least one pair of probe pins composed of tungsten type materials is used. The probe pin is formed, for example, by working a metal wire having a diameter of 50 µm to 300 µm so as to have a needle-shape at distal end of the metal wire. When these probe pins of the probe card are contacted to the semiconductor integrated circuit with a predetermined contact pressure, an electrical conduction between circuits is confirmed to be correct. According to the wafer test, a normal function and a good operation of the respective circuits are confirmed.

As a material for constituting the above probe pin, there have been generally used metal materials that are mainly composed of tungsten type material, precious metal material, precious metal alloy material or the like. In particular, there has been widely used a doped tungsten containing a minute amount of aluminum, potassium, silicon or the like as doping agent (dopant), or there has been used a rhenium-tungsten alloy containing about 1 to 30 mass % of rhenium and having a high strength and a high hardness.

The above probe pin is composed of above various materials, and manufactured by a method comprising the steps of: cutting a metal wire having a diameter of about 70 µm to 400 µm into wire elements each having a length of about 30 mm to 100 mm; machine-working (grinding working or the like) a tip end portion of each wire elements; and conducting a bending process to a portion close to the tip end portion 2 of the probe pin 1 so that the probe pin is worked to have a predetermined shape including a bent portion 7 as shown in FIG. 5. Thus prepared probe pins are attached to a probe card (Refer to Patent Document 1).

As described above, as the bending process for forming the metal wire into a predetermined shape after the tip end portion is subjected to the grinding-work, there has been generally adopted a process in which a stress in a bending direction is applied to the metal wire or the metal wire is formed by using a metal molding die.

However, since a diameter of a body portion of the metal wire is several hundreds µm while a needle-shaped portion of the tip end portion is extremely thin which is worked to have a diameter of only several tens µm, the following problems have been posed. Namely, at the time of conducting the process of bending the metal wire, a breakage is easily occurred to the needle-shaped portion, so that a lowering of a production yield of the probe pin at the bending process is easily occurred. Further, when the probe pins assembled in the probe card are used, the breakage of the probe pin easily occurs in a short period of time, and this defect is one reason of the probe pin having a short life span. Patent Document 1: Japanese Patent Application (Laid-Open) No. 6-50987

DISCLOSURE OF INVENTION

The present invention directs to a probe pin formed with a tapered portion which is formed by machine-working a tip end portion of a metal wire. An angle constituted by a direction of grooves (striations, streaks) formed at the tapered tip end portion of the probe pin by the machine-working of the tip end portion and a longitudinal direction of the metal wire is set to a range from 45 degree to almost zero degree, preferably both the directions are almost parallel to each other.

Accordingly, an object of the present invention is to provide a probe pin and a method of manufacturing the probe pin capable of effectively suppressing a breakage of the probe pin during a bending work process of the tip end portion of the probe pin and when the probe pin is actually used as a product, and capable of drastically improving a production yield of the resultant probe pin, together with quality and durability (longevity) of the probe pin.

In order to achieve the above object, the present invention provides a probe pin formed with a tapered portion which is formed by machine-working a tip end portion of a metal wire, wherein an angle constituted by a direction of grooves (striations, streaks) formed by the machine-working of the tip end portion and a longitudinal direction of the metal wire is 45 degree or less.

Further, in the above probe pin, it is preferable that the tip end portion of the probe pin has a surface roughness Ra of 5 µm or less.

In another aspect of the present, there is provided a method of manufacturing the probe pin comprising:

a preparing step for preparing a probe pin raw material by cutting a metal wire; and a working step for forming a tapered portion by machine-working the tip end portion of the probe pin raw material;

wherein the machine-work is a grinding work in which the tip end portion of the probe pin raw material abuts against a grinding surface of a rotary-type grinding wheel (grinding stone) whereby the tip end portion is ground, and an angle constituted by a traveling direction of the grinding surface of the grinding wheel and a longitudinal direction of the metal wire is set to 45 degree or less.

In the above method of manufacturing the probe pin, it is preferable that the traveling direction of the grinding surface of the rotary grinding wheel is almost parallel with the longitudinal direction of the metal wire.

Further, in the above method of manufacturing the probe pin, it is also preferable that a rotation number of the grinding wheel is set to a range of 100 rpm to 20000 rpm.

Furthermore, in the above method of manufacturing the probe pin, it is also preferable that a cutting rate of the grinding wheel with respect to the metal wire is 0.01 mm/sec or more and 5 mm/sec or less.

Further, in the above method of manufacturing the probe pin, it is also preferable that a mesh size of abrasive grains (abrasive coatings) contained in the grinding wheel is controlled to be 120 or more and 2000 or less.

Still further, in the above method of manufacturing the probe pin, it is also preferable that the grinding work as grinding step is performed in a state where a grinding liquid is coated onto the grinding surface of the metal wire.

The probe pin having the above structure and configuration is suitably applied and used to a probe card.

EFFECTS OF THE INVENTION

According to the probe pin and the method of manufacturing the probe pin of this invention, the breakage of the tip end portion of the probe pin can be effectively suppressed during the bending work process of the tip end portion of the probe pin and when the probe pin is actually used as a product. Therefore, a production yield, quality and durability (longevity) of the probe pin can be drastically improved.

Hereinafter, the present invention will be explained in more detail.

The present invention directs to a probe pin formed with a tapered portion which is formed by machine-working a tip end portion of a metal wire. The probe pin is characterized in that an angle constituted by a direction of the formed groove generated by the machine work for the tip end portion and a longitudinal direction of the metal wire is 45 degree or less.

As a material for constituting the probe pin, there can be suitably used a doped tungsten containing a trace amount of aluminum, potassium, silicon or the like as doping agent (dopant), tungsten type material such as rhenium-tungsten (Re—W) containing about 1-30 mass % of rhenium, or metal wire materials that are mainly composed of precious metal material, precious metal alloy material or the like.

The above probe pin is composed of above various materials, and manufactured by a method comprising the steps of: cutting a metal wire having a diameter of about 70 μm to 400 μm into wire elements each having a length of about 30 mm to 100 mm; and conducting a machine-work such as grinding work or the like thereby to work the tip end portion so as to realize a sharpened shape.

The probe pin according to the present invention is characterized in that an angle constituted by a direction of the work groove generated at the tip end portion and a longitudinal direction of the metal wire is 45 degree or less. When the machine work is conducted to the tip end portion, an impact load due to the machine work is applied to the probe pin, so that fine recessed portions (concave portions) are disadvantageously formed onto a surface of the probe pin.

After the tip end portion of the probe pin is worked so as to have a needle-shape, in order to form the probe pin to have a predetermined shape, there is performed a bending work process in which a stress in a bending direction is applied to a wire material under a state where the tip end portion is fixed, or the wire material is bent by using a metal molding die.

In this case, the metal wire is worked such that a body portion of the metal wire has a large diameter of several hundreds μm while the needle-shaped portion of the tip end portion is worked to be extremely thin state having a diameter of only several tens μm. Therefore, when the bending work process is performed, there has been posed a problem such that the fine recessed portion (groove) generated at the machine-work functions as a starting point of advancing a breakage and the recessed portion exhibits, so called, a notch effect. As a result, the thin needle-shaped tip end portion is easily broken due to the notch effect.

In a case where the recessed portion (groove) is generated in a direction normal to a bending work direction of the metal wire, when the metal wire is bent, the metal wire is liable to break at this recessed portion as the starting point of the breakage. However, in case of the probe pin according to the present invention, since the angle constituted by the direction of the work groove generated by the machine work at the end portion of the metal wire and the longitudinal direction of the metal wire is set to 45 degree or less, even if the recessed portion exists on the surface of the metal wire, the forming direction of the recessed portion exists in a direction at which the notch is not formed. Therefore, even if a pressure or stress for the bending work is applied to the metal wire, it becomes possible to effectively suppress the breakage of the probe pin, which is caused by the recessed portion as the starting point of breakage.

In a case where the angle constituted by the forming direction of the work groove generated at the tip end portion of the metal wire and the longitudinal direction of the metal wire exceeds 45 degree, there is appeared and configured a state where the recessed portion caused by the grinding work at the surface of the metal wire is formed in a direction almost normal to the bending direction. Therefore, the recessed portion will function as the notch, so that the breakage becomes liable to easily occur at the time of bending work because the recessed portion functions as a starting point of the breakage, thus being not preferable indeed. The angle constituted by the forming direction of the work groove generated at the tip end portion and the longitudinal direction of the metal wire is preferably set to 20 degree or less, more preferably to 5 degree or less.

In the above probe pin, it is preferable that the tip end portion of the probe pin has a surface roughness Ra of 5 μm or less. When the surface roughness Ra exceeds 5 μm, a size of the recessed portion generated by the machine-work conducted to a surface of the tip end portion becomes large, so that the breakage is liable to easily occur at the time of bending work of the tip end portion, thus being not preferable. The surface roughness Ra is preferably set to 3 μm or less.

The probe pin of the present invention is preferably manufactured under a condition where the grinding wheel (grinding stone) is relatively moved in a direction parallel to the longitudinal direction of the metal wire. Normally, a work to the tip end portion of the probe pin is performed while the metal wire is rotated around its axial direction. In order to make the surface roughness small, it is preferable that the work to the tip end portion of the probe pin is performed by a grinding work.

Further, it is also preferable that the grinding wheel is movable in a direction parallel to the longitudinal direction of the metal wire. In the present invention, the term "parallel direction" means that the angle constituted by a moving direction of the grinding wheel and the longitudinal direction of the metal wire is 45 degree or less, preferably almost zero. When the grinding wheel is moved in such direction, the recessed portion generated at the tip end portion is formed in a direction at an angle of 45 degree or less with respect to the longitudinal direction of the metal wire, and the both directions become almost parallel to each other. Namely, the direction of the recessed portion generated at the surface of the metal wire is almost parallel to the bending direction, so that it becomes possible to reduce the breakage which starts from the recessed portion as the starting point of breakage at the bending work process.

Further, the probe pin of the present invention is preferably manufactured under a condition where the traveling direction of the grinding surface of the grinding wheel is set to be almost parallel with the longitudinal direction of the metal wire. In this connection, the term "parallel direction" means that the angle constituted by a rotating direction of the grinding wheel and the longitudinal direction of the metal wire is 45 degree or less. When the grinding wheel is rotated in such direction, the recessed portion generated at the tip end portion is formed in a direction at an angle of 45 degree or less with respect to the longitudinal direction of the metal wire, and the both directions become almost parallel to each other. Namely, the direction of the recessed portion generated at the surface of the metal wire is almost parallel to the bending direction, so that it becomes possible to reduce the breakage which starts from the recessed portion as the starting point of breakage at the bending work process.

In the method of manufacturing the probe pin according to the present invention, it is preferable that a rotation number of the grinding wheel is set to 100 rpm to 20000 rpm. When the rotation number of the grinding wheel is less than 100 rpm, a resistance in grinding work of the probe pin is disadvantageously increased and the surface roughness of the ground surface is also increased, thus being not preferable.

On the other hand, in a case where the rotation number of the grinding wheel exceeds 20000 rpm, a load to be applied to a grinding machine is increased, thus being also not preferable. A more preferable range of the rotation number of the grinding wheel is 500 to 5000 rpm.

Further, in the method of manufacturing the probe pin according to the present invention, it is also preferable that a cutting rate (cut-in speed) of the grinding wheel with respect to the metal wire is 0.01 mm/sec or more and 5 mm/sec or less. When the cutting rate with respect to the metal wire is less than 0.01 mm/sec, a working rate (working speed) is disadvantageously lowered, so that a manufacturing cost of the probe pin is remarkably increased, and it is not preferable.

On the other hand, in a case where the cutting rate of the grinding wheel with respect to the metal wire exceeds 5 mm/sec, a cutting resistance is increased and the surface roughness will become coarse. These disadvantages become factors of generating the recessed portion (work grooves), thus being not preferable. In addition, a size and a depth of the recessed portion are increased. A more preferable range of the cutting rate of the grinding wheel with respect to the metal wire is 0.01 mm/sec to 1 mm/sec.

Furthermore, in the method of manufacturing the probe pin according to the present invention, it is also preferable that a mesh size of abrasive grains (abrasive coatings) contained in the grinding wheel is controlled to be 120 or more and 2000 or less. In a case where the mesh size of abrasive grains is less than 120, the surface roughness of the metal wire will be increased. This becomes one factor of causing cracks, so it is not preferable.

On the other hand, in a case where the mesh size of abrasive grains exceeds 2000, workability is lowered, so that a work speed slows down and an efficiency of manufacturing the probe pin is also lowered, thus being not preferable indeed. A more preferable range of the mesh size of abrasive grains is 500 to 1500.

Still further, in the grinding work used in the method of manufacturing the probe pin according to the present invention, it is also preferable that the grinding work as grinding step is performed in a state where a grinding fluid is coated onto the grinding surface of the metal wire. When the grinding fluid is used, it becomes possible to lower the resistance of the metal wire in the grinding work process, so that a generation of burning or sticking can be suppressed, and it also becomes possible to reduce the generation of the recessed portion to be formed on a surface of the metal wire. Further, a grinding trash generated by the grinding work can be effectively removed. Therefore, even in a case where a continuous work is performed, it becomes possible to maintain a high working accuracy for a long period of time.

According to the probe pin and the method of manufacturing the probe pin of the present invention as described above, the direction of fine recessed portion formed by the machine-working of the tip end portion is almost parallel with the longitudinal direction of the metal wire. Therefore, when the tip end portion of the probe pin is subjected to the bending work, it becomes possible to effectively suppress and decrease the breakage which advances from the recessed portion as a starting point of the breakage. Such probe pin can drastically improve a production yield in the manufacturing process of the prove pin, and the probe pin has a high quality and durability, so that the probe pin can be suitably applied to a probe card.

1, 1a, 1b, 1c, 1d probe pin
2, 3a, 3b, 3c, 3d tip end portion
4a, 4b, 4c, 4d work groove (recessed portion, concave portion)
5 rotary grinding wheel
6 probe pin raw material
7 bent portion
G traveling direction of grinding surface
c longitudinal direction of metal wire

BEST MODE FOR CARRYING OUT THE INVENTION

Next, detailed description of embodiments of the present invention will be made by way of the following Examples and Comparative Examples, with reference to the accompanying drawings.

Examples 1 to 12 and Comparative examples 1 to 4

For the purpose of working probe pins, there were prepared metal wires each having a diameter of 0.3 mm and a length of 50 mm that were composed of various materials such as tungsten (W) wires, rhenium tungsten (Re—W) wires, thorium tungsten (Th—W) wires, precious metal (gold, silver, platinum, ruthenium, rhodium, osmium, iridium) wires, and precious metal alloy wires, as shown by listing in Table 1.

Using these metal wires (probe pin raw materials), there were prepared probe pins each having a diameter of 5 μm at a needle portion of the tip end portion and having a spread angle of 3.3 degree from the tip end portion.

Figure 4:
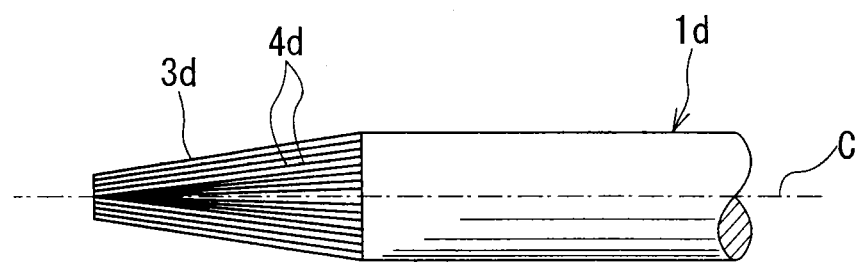
FIG. 4 is a side view illustrating a surface state of a probe pin of still another embodiment formed in accordance with the method according to the present invention.
Figure 6:
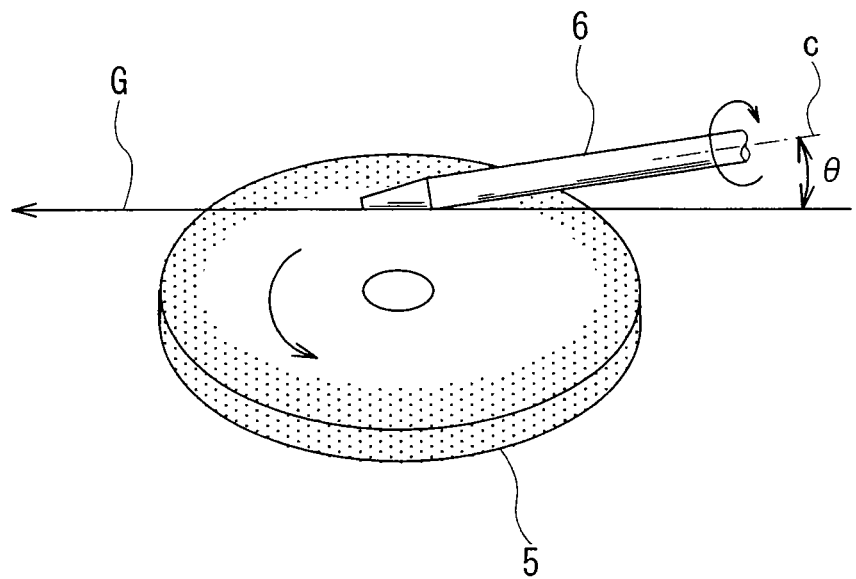
FIG. 6 is a perspective view illustrating a state where the tip end portion is worked by using a rotary grinding device (grinding wheel) in accordance with the method according to the present invention.

As a means for forming a tapered portion at a tip end portion of the above metal wire (probe pin raw material), a rotary disc-type grinding wheel 5 as shown in FIG. 6 was used. That is, under a state where the tip end portion of the probe pin raw material 6 was abutted against a surface of the rotary disc-type grinding wheel 5, the grinding wheel 5 was rotated. Simultaneously, the probe pin raw material 6 was rotated around an axis thereof, thereby to prepare probe pins 1a, 1b, 1d having the tapered and frustum-shaped tip end portions 3a, 3b and 3d, as shown in FIGS. 1, 2 and 4.

Figure 3:
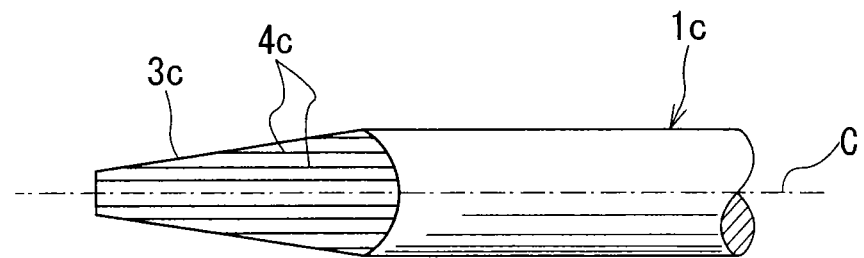
FIG. 3 is a side view illustrating a surface state of a probe pin of another embodiment formed in accordance with the method according to the present invention.

On the other hand, there can be also adopted another method of manufacturing the probe pin as shown in FIG. 3 in which the grinding wheel 5 is rotated, but the probe pin raw material 6 is not rotated around the axis thereof. Under this state, only four inclined plan surfaces of a tip end portion 3c are ground, so that there can be also provided a prove pin 1c formed with a tapered tip end portion 3c having a quadrangular pyramid shape.

In this connection, in the above grinding work, as shown in FIG. 6, an angle θ constituted by a traveling direction of a grinding surface of the grinding wheel 5 and a longitudinal direction C of the metal wire (probe pin raw material) was changed, so that an angle θ constituted by a direction of work grooves 4a, 4b, 4c, 4d generated at the tip end portions 3 and a longitudinal direction C of the metal wire (probe pin raw material) was adjusted to be the angles shown in Table 1.

Figure 1:
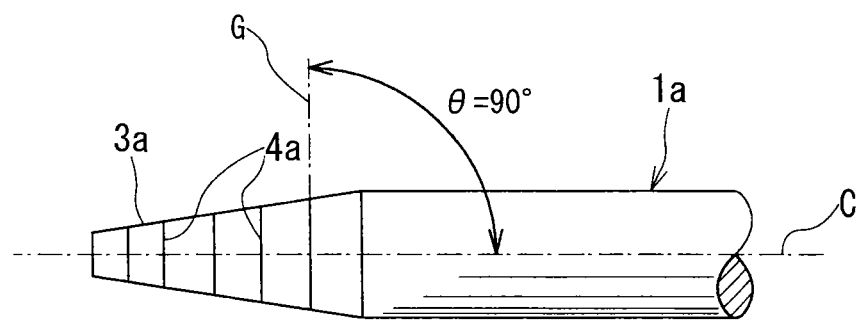
FIG. 1 is a side view illustrating a surface state of a conventional probe pin after completion of the machine work for the tip end portion of the probe pin.
Figure 2:
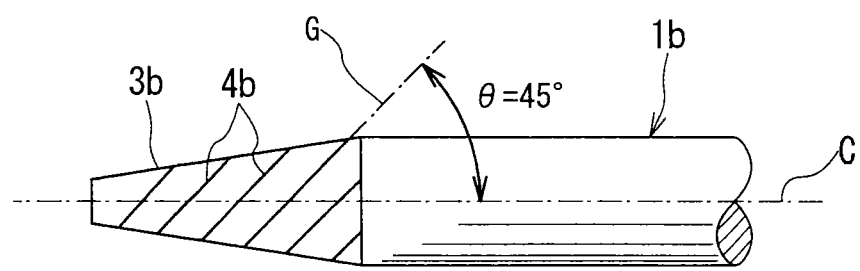
FIG. 2 is a side view illustrating a surface state of a probe pin of one embodiment formed in accordance with a method according to the present invention.

In the probe pin 1a as shown in FIG. 1, the angle θ constituted by the direction of work grooves 4a and the longitudinal direction C of the metal wire is about 90 degree, so that the probe pin 1a corresponds to Comparative Examples 1 to 4.

The probe pin 1b as shown in FIG. 2 has a feature that the angle θ constituted by the direction of work grooves 4b and the longitudinal direction C of the metal wire is about 45 degree, so that the probe pin 1b corresponds to Examples 1.

The probe pins 1c and 1d as shown in FIGS. 3 and 4, the angle θ constituted by the direction of work grooves 4c, 4d and the longitudinal direction C of the metal wire is 5 degree or less, so that the probe pins 1c, 1d correspond to Examples 3 to 12.

Figure 5:
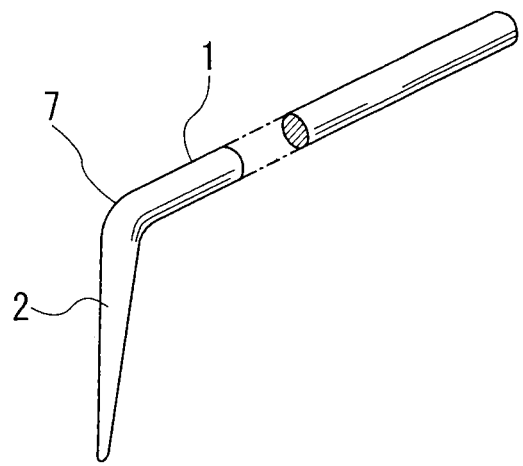
FIG. 5 is a perspective view illustrating an outer configuration of a probe pin which is bent at a portion close to the tip end portion after the tip end portion is worked in accordance with the method according to the present invention.

With respect to the probe pins 1 according to thus prepared respective Examples and Comparative Examples, each of the probe pins 1, the tip end portion of the respective probe pins 1 was inserted into a hole having an inner diameter of 30 μm thereby to fix the probe pin 1. Then, a bending work was performed at a portion close to the tip end portion by applying a bending stress to the portion. As a result, as shown in FIG. 5, a bent portion 7 was formed at the portion close to the tip end portion 2.

In this bending work process, a frequency of breakage of the respective probe pins during the bending work process was measured and evaluated, and fraction defectives of the probe pin due to the breakage were calculated. The results of the measurements and the evaluations were obtained as shown in Table 1 hereunder.

TABLE 1

| Sample No. | Material | Angle between Work Groove and Long Direction of Wire θ (°) | Surface Roughness Ra (μm) | Rotation Number of Grinding Stone (rpm) | Cutting Rate (mm/sec) | Grinding Fluid | Fraction Defective (ppm) |
|---|---|---|---|---|---|---|---|
| Example 1 | Rhenium Tungsten | 45 | 2.5 | 2000 | 0.05 | Use | <1 |
| Example 2 | Tungsten | 20 | 2.3 | 2000 | 0.05 | Use | <1 |
| Example 3 | Rhenium Tungsten | 5° or less~ (almost zero) | 2.5 | 2000 | 0.05 | Use | <1 |
| Example 4 | Rhenium Tungsten | 5° or less~ (almost zero) | 4.3 | 2000 | 0.05 | Nonuse | <1 |
| Example 5 | Rhenium Tungsten | 5° or less~ (almost zero) | 3.5 | 100 | 0.05 | Use | <1 |
| Example 6 | Rhenium Tungsten | 5° or less~ (almost zero) | 1.0 | 20000 | 0.05 | Use | <1 |
| Example 7 | Rhenium Tungsten | 5° or less~ (almost zero) | 0.8 | 2000 | 0.01 | Use | <1 |
| Example 8 | Rhenium Tungsten | 5° or less~ (almost zero) | 4.8 | 2000 | 5.0 | Use | <1 |
| Example 9 | Rhenium Tungsten | 5° or less~ (almost zero) | 5.5 | 2000 | 5.3 | Use | <1 |
| Example 10 | Pt—Au—Ag—Pd Alloy | 3.3° | 0.5 | 500 | 0.2 | Use | <1 |
| Example 11 | Pt—Au—Ag Alloy | 2.3° | 0.3 | 1000 | 0.6 | Nonuse | <1 |
| Example 12 | Iridium Alloy | 5° or less~ (almost zero) | 2.0 | 2000 | 0.05 | Nonuse | <1 |
| Comparative Example 1 | Tungsten | 90 | 2.3 | 2000 | 0.05 | Use | 2 |
| Comparative Example 2 | Rhenium Tungsten | 90 | 1.2 | 2000 | 0.02 | Use | 2 |
| Comparative Example 3 | Pt—Au—Ag Alloy | 90 | 0.3 | 1000 | 0.2 | Use | 2 |
| Comparative Example 4 | Iridium Alloy | 90 | 2.1 | 2000 | 0.05 | Nonuse | 2 |

As is clear from the results shown in above Table 1, according to the probe pins of the respective Examples in which the angle constituted by the forming direction of grooves 4 and the longitudinal direction C of the metal wire is set to 45 degree or less, the direction of the groove 4 generated at the grinding work is not greatly deviated from the longitudinal direction C of the metal wire, or both the directions can be formed to be almost parallel to each other, so that it was confirmed that the breakage of the probe pin caused by the bending work process could be reduced and the quality of the prove pin was significantly improved.

INDUSTRIAL APPLICABILITY

As described above, according to the probe pin and the method of manufacturing the probe pin of the present invention, the breakage of the tip end portion of the prove pin can be effectively suppressed during the bending work process of the tip end portion of the probe pin and when the probe pin is actually used as a product, so that the production yield, quality and durability (longevity) of the probe pin can be drastically improved when used as a component of a probe card or the like.

The invention claimed is:

1. A method of manufacturing a probe pin, comprising:
preparing a probe pin raw material by cutting a metal wire; and
forming a tapered portion by machine-working a tip end portion of the probe pin raw material while the probe pin raw material is continuously rotated around an axis thereof while forming an entirety of the tapered portion;
wherein said machine-working is a grinding work in which the tip end portion of the probe pin raw material abuts against a grinding surface of a rotary-type grinding wheel whereby the tip end portion is ground thereby to form the tapered portion having a frustum-shape, and an angle constituted by a traveling direction of the grinding surface of the grinding wheel and a longitudinal direction of the metal wire is set to 45 degree or less, and
wherein a rotation number of the grinding wheel is 500 to 5000 rpm, a cutting rate of the grinding surface with respect to the metal wire is within a range of 0.01 to 5 mm/sec, a mesh size of abrasive grains is 500 to 1500, and a tip end portion of the probe pin has a surface roughness Ra of 5 μm or less.

2. The method of manufacturing the probe pin according to claim 1, wherein said traveling direction of the grinding surface of the rotary grinding wheel is substantially parallel with the longitudinal direction of the metal wire.

3. The method of manufacturing the probe pin according to claim 1, wherein said grinding work is performed in a state where a grinding fluid is coated onto the grinding surface of the metal wire.

* * * * *